(12) United States Patent
Ueyama

(10) Patent No.: US 9,472,867 B2
(45) Date of Patent: Oct. 18, 2016

(54) ELECTRIC CONTACT AND ELECTRIC COMPONENT SOCKET

(71) Applicant: ENPLAS CORPORATION, Kawaguchi (JP)

(72) Inventor: Yuki Ueyama, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 14/778,804

(22) PCT Filed: Mar. 6, 2014

(86) PCT No.: PCT/JP2014/055736
§ 371 (c)(1),
(2) Date: Sep. 21, 2015

(87) PCT Pub. No.: WO2014/156531
PCT Pub. Date: Oct. 2, 2014

(65) Prior Publication Data
US 2016/0056549 A1    Feb. 25, 2016

(30) Foreign Application Priority Data
Mar. 27, 2013    (JP) .................................. 2013-065638

(51) Int. Cl.
*H01R 13/24* (2006.01)
*H01R 4/48* (2006.01)
(Continued)

(52) U.S. Cl.
CPC .............. *H01R 4/48* (2013.01); *G01R 1/0466* (2013.01); *G01R 1/0483* (2013.01); *G01R 1/06722* (2013.01); *H01R 13/2421* (2013.01)

(58) Field of Classification Search
CPC .............. H01R 11/18; H01R 13/2421; H01R 13/2428
USPC .................................. 439/700, 66, 140, 141
See application file for complete search history.

(56) References Cited

U.S. PATENT DOCUMENTS 6,948,945 B2 *  9/2005  Chen .................... H01R 13/112
                                                      439/141
7,845,955 B2 * 12/2010  Nakayama ......... G01R 1/07371
                                                      439/66

(Continued)

FOREIGN PATENT DOCUMENTS

JP    3121735    5/2006
JP    2008-14704    1/2008

(Continued)

OTHER PUBLICATIONS

International Search Report mailed May 27, 2014 in corresponding international application PCT/JP2014/055736.

*Primary Examiner* — Phuong Dinh
(74) *Attorney, Agent, or Firm* — Staas & Halsey LLP

(57) ABSTRACT

Provided is an electric contact with a stable electric resistance value. An insertion rod portion passing through a coil spring is provided on a first contact member, and a cylindrical portion in which a part of the insertion rod portion passing through the coil spring is provided on a second contact member. A tilt mechanism tilts the second contact member to bring the insertion rod portion into contact with the cylindrical portion. This can stabilize the electric resistance value. A reduced diameter portion in which the diameter decreases with an increase in the distance from the cylindrical portion is formed at least near a tip of the insertion rod portion. This can suppress changes in the contact pressure of the cylindrical portion and the insertion rod portion to make expansion and contraction operation smooth.

4 Claims, 13 Drawing Sheets

(51) Int. Cl.
*G01R 1/04* (2006.01)
*G01R 1/067* (2006.01)

(56) References Cited

U.S. PATENT DOCUMENTS 8,519,727 B2 * 8/2013 Yamamoto ......... G01R 1/06722
324/755.05
8,758,067 B2 * 6/2014 Rathburn ............... H01R 12/52
439/66
2010/0159731 A1 6/2010 Kunioka et al.

FOREIGN PATENT DOCUMENTS

| JP | 2008-298792 | 12/2008 |
| JP | 2010-170980 | 8/2010 |

* cited by examiner

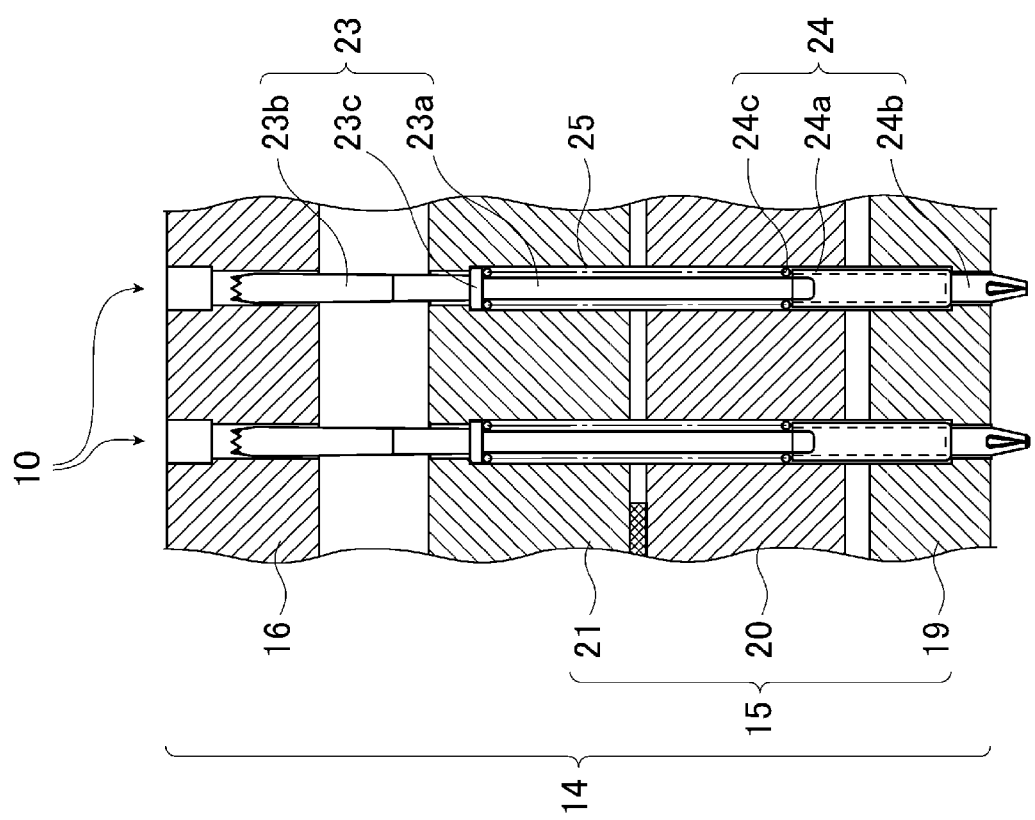

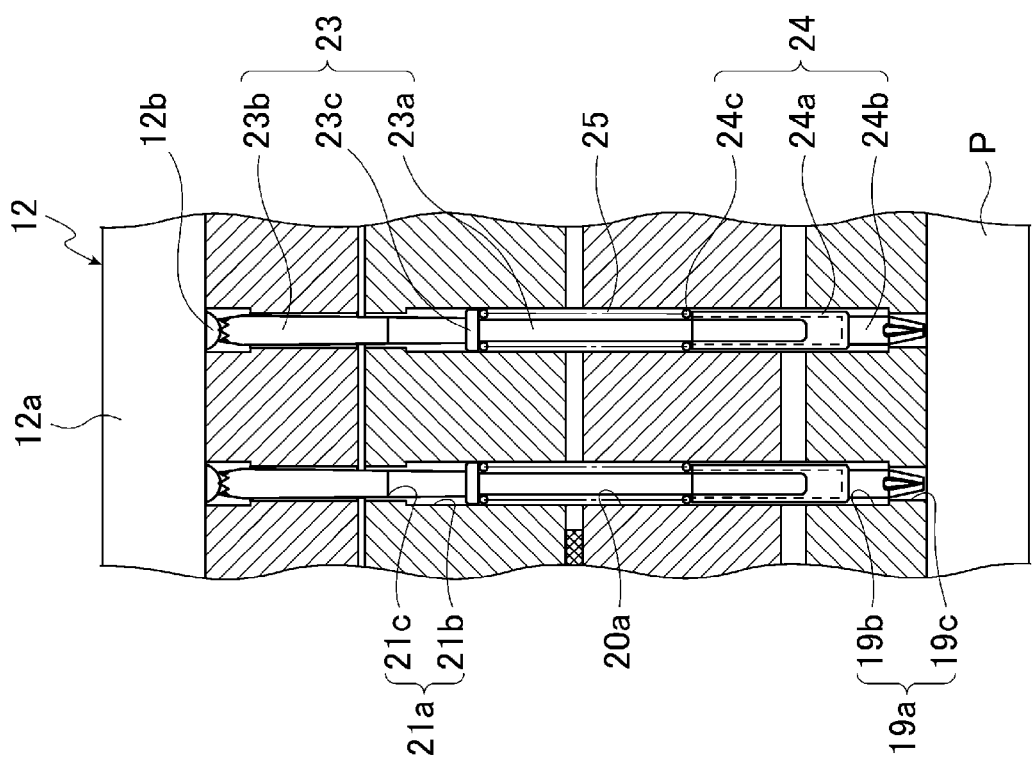

25

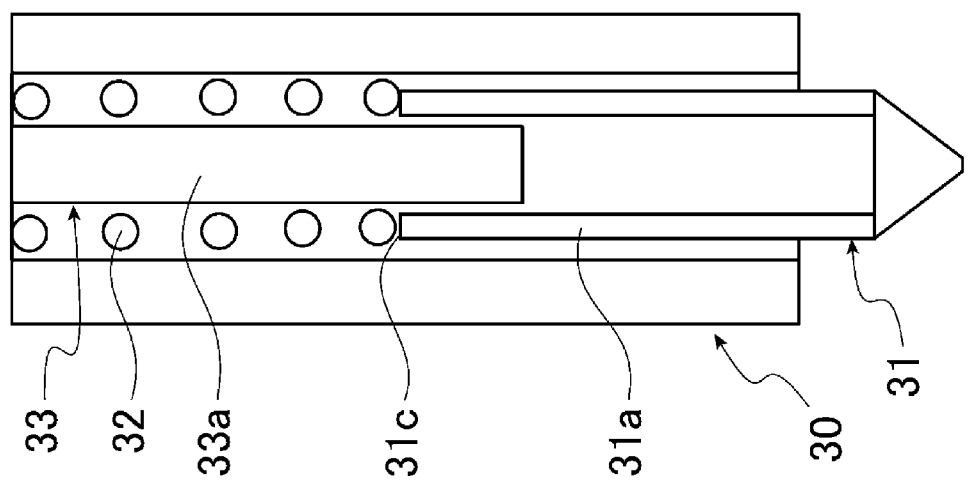

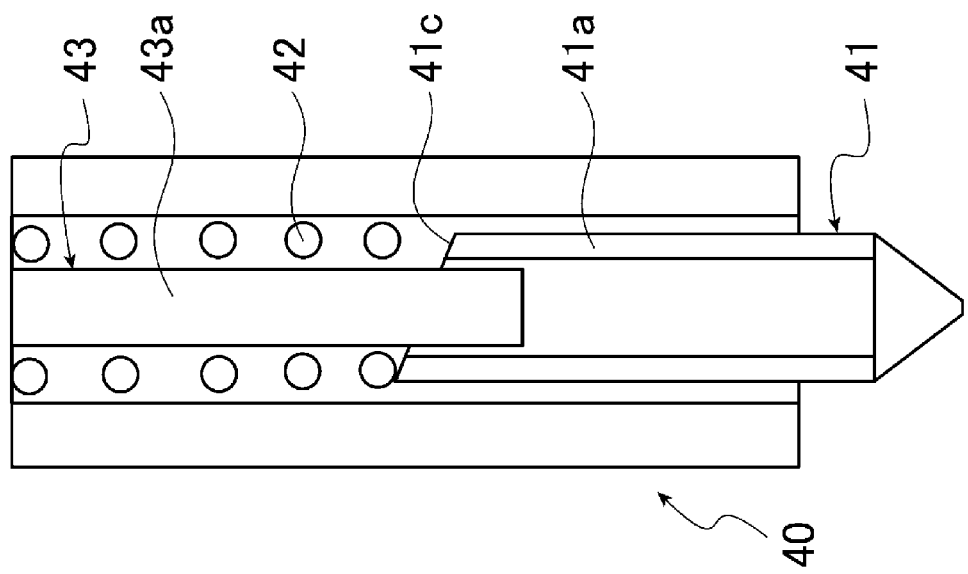

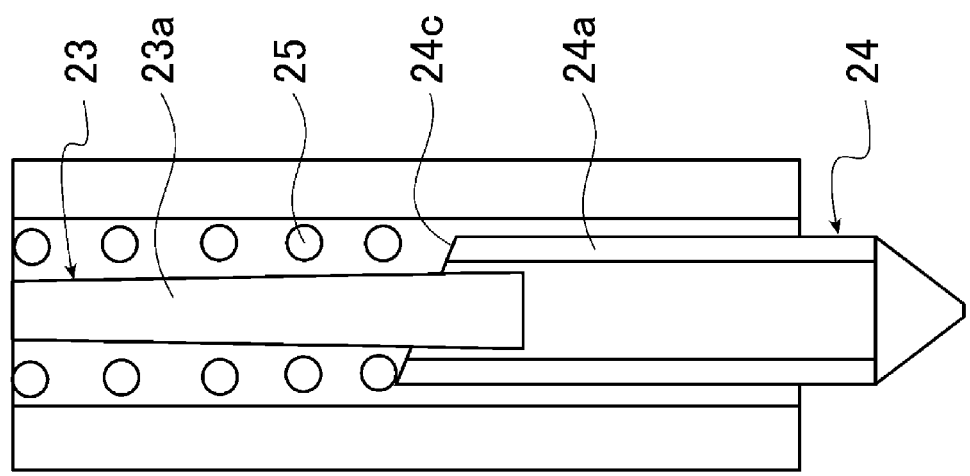

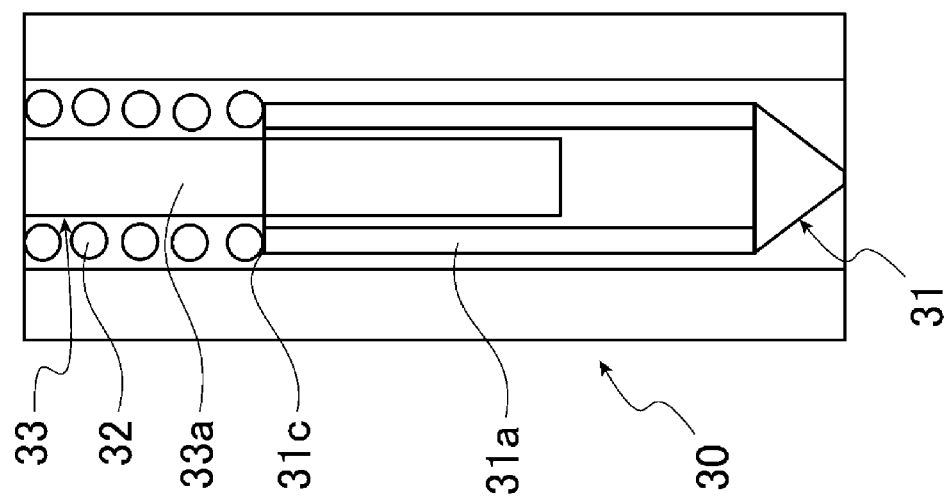

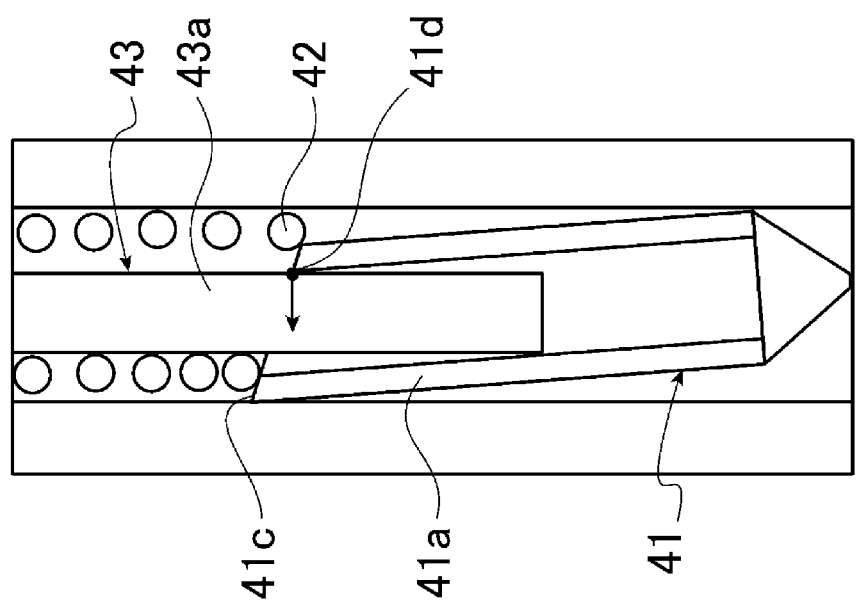

ELECTRIC CONTACT AND ELECTRIC COMPONENT SOCKET

CROSS-REFERENCE TO RELATED APPLICATIONS

This application is a national stage filed under 35 USC 371 of International Application PCT/JP2014/055736 filed Mar. 6, 2014, and claims foreign priority to Japanese application 2013-065638 filed Mar. 27, 2013, and which are incorporated herein by reference in their entireties.

TECHNICAL FIELD

The present invention relates to an electric contact for electrically connecting an electric component, such as a semiconductor device (hereinafter, called "IC package"), to a wiring board and relates to an electric component socket using the electric contact.

BACKGROUND ART

Conventionally, an electric contact described for example in Japanese Patent Laid-Open No. 2008-298792 (hereinafter called Patent Literature 1) is known as the electric contact of this type.

In the electric contact of Patent Literature 1, a guide tube is attached to a lower side probe pin. A compression coil spring is arranged on an upper end of the guide tube. A guide shaft portion of an upper side probe pin is inserted to the compression coil spring, and a lower end portion of the compression coil spring is abutted to an upper end side opening surface of the guide tube. In this state, the electric contact is attached to a casing. As a result, the energizing force of the compression coil spring can press the upper side probe pin against a main substrate and press the lower side probe pin against a semiconductor integrated circuit to electrically connect the main substrate and the semiconductor integrated circuit (see paragraph [0038], FIGS. 1 and 4, and the like of Patent Literature 1).

SUMMARY OF INVENTION

Technical Problem

However, in the conventional electric contact, when the compression coil spring is compressed to connect the main substrate and the semiconductor integrated circuit, the compression coil spring may be deflected and come into contact with the guide shaft portion. If the compression coil spring and the guide shaft portion come into contact with each other, a current flows at the contact part, and the electric resistance of the electric contact is reduced. Therefore, the electric resistance of the electric contact is significantly changed by the degree of deflection of the compression coil spring. The amount of deflection of the compression coil spring changes every time connection operation of the main substrate and the semiconductor integrated circuit is performed (that is, every time the compression coil spring is expanded and contracted).

For this reason, the conventional electric contact of this type has a drawback that a stable electric resistance value with little change cannot be obtained.

Thus, an object of the present invention is to provide an electric contact and an electric component socket with little change in an electric resistance value.

Solution to Problem

To solve the problem, the present invention provides an electric contact to electrically connect a wiring board and an electric component by using: a first contact member conducted with one of the wiring board and the electric component; a second contact member conducted with the other of the wiring board and the electric component; and a coil spring to energize the first contact member and the second contact member in opposite directions, wherein the first contact member includes an insertion rod portion passing through the coil spring, the second contact member includes a cylindrical portion to which a part of the insertion rod portion passing through the coil spring is inserted, a reduced diameter portion in which the diameter decreases with an increase in the distance from the cylindrical portion is formed at least near a tip of the insertion rod portion, and the electric contact includes a tilt portion to tilt the second contact member to bring an opening end inside surface of the cylindrical portion into contact with the insertion rod portion.

In the electric contact according to the present invention, it is desirable that the tilt portion is an opening surface of the cylindrical portion having a surface direction titled from an expansion and contraction direction of the coil spring, and the opening surface is pressed by energizing force of the coil spring to tilt the second contact member.

The present invention provides an electric component socket including: a socket main body arranged on a wiring board and including a housing portion to house an electric component; and an electric contact to electrically connect the wiring board and the electric component arranged on through holes provided on the socket main body, wherein the electric contact includes: a first contact member conducted with one of the wiring board and the electric component; a second contact member conducted with the other of the wiring board and the electric component; and a coil spring to energize the first contact member and the second contact member in opposite directions, wherein the first contact member includes an insertion rod portion passing through the coil spring, the second contact member includes a cylindrical portion to which a part of the insertion rod portion passing through the coil spring is inserted, a reduced diameter portion in which the diameter decreases with an increase in the distance from the cylindrical portion is formed at least near a tip of the insertion rod portion, and the electric contact includes a tilt mechanism to tilt the second contact member to bring an opening end inside surface of the cylindrical portion into contact with the insertion rod portion.

In the electric component socket according to the present invention, it is desirable that the tilt mechanism is an opening surface of the cylindrical portion having a surface direction titled from an expansion and contraction direction of the coil spring, and the opening surface is pressed by energizing force of the coil spring to tilt the second contact member.

Advantageous Effects of Invention

According to the electric contact of the present invention, the second contact member is tilted by the tilt portion, and the cylindrical portion of the second contact member and the insertion rod portion of the first contact member can be surely brought into contact with each other regardless of the amount of deflection of the coil spring. Therefore, the electric resistance of the electric contact can be stabilized.

Furthermore, according to the electric contact of the present invention, the reduced diameter portion is provided at least near the tip of the insertion rod portion, and the contact pressure of the cylindrical portion and the insertion rod portion in the transverse direction is unlikely to be changed according to the amount of expansion and contraction of the coil spring, even though the insertion rod portion is tilted. Therefore, according to the present invention, the expansion and contraction operation of the electric contact can be stable.

In the electric contact according to the present invention, the opening surface in the surface direction tilted from the expansion and contraction direction of the coil spring is provided on the cylindrical portion to form the tilt portion, and the second contact member can be tilted by simple configuration.

According to the electric component socket of the present invention, the electric contact according to the present invention is arranged in the through holes of the socket main body. Therefore, an electric component socket with little change in the electric resistance can be provided.

BRIEF DESCRIPTION OF DRAWINGS

FIG. 1A is a partial cross-sectional view of an IC socket according to a first embodiment of the present invention, showing a state in which a floating plate is raised.

FIG. 1B is a partial cross-sectional view of the IC socket according to the first embodiment of the present invention, showing a state in which the floating plate is lowered.

FIG. 5A is a conceptual cross-sectional view for describing operation of a first comparative example.

FIG. 5B is a conceptual cross-sectional view for describing operation of a second comparative example.

FIG. 5C is a conceptual cross-sectional view for describing operation of the first embodiment.

FIG. 6A is a conceptual cross-sectional view for describing operation of the first comparative example.

FIG. 6B is a conceptual cross-sectional view for describing operation of the second comparative example.

DESCRIPTION OF EMBODIMENTS

First Embodiment of Invention

Figure 2A:
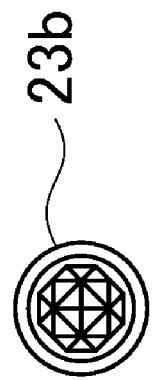
FIG. 2A is a schematic plan view showing a first contact member of an electric contact according to the first embodiment.
Figure 2B:
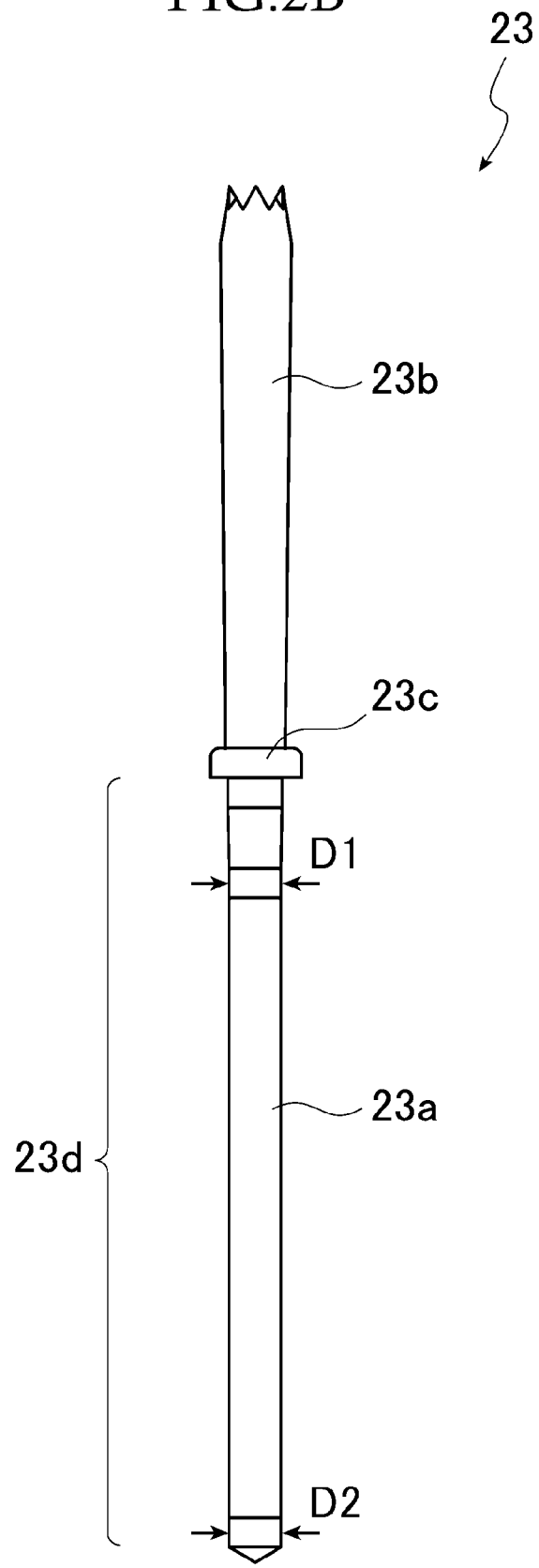
FIG. 2B is a schematic front view showing the first contact member of the electric contact according to the first embodiment.
Figure 3A:
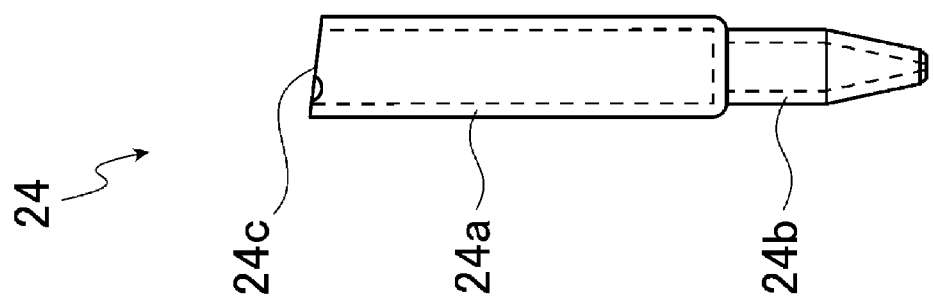
FIG. 3A is a schematic front view showing a second contact member of the electric contact according to the first embodiment.
Figure 3B:
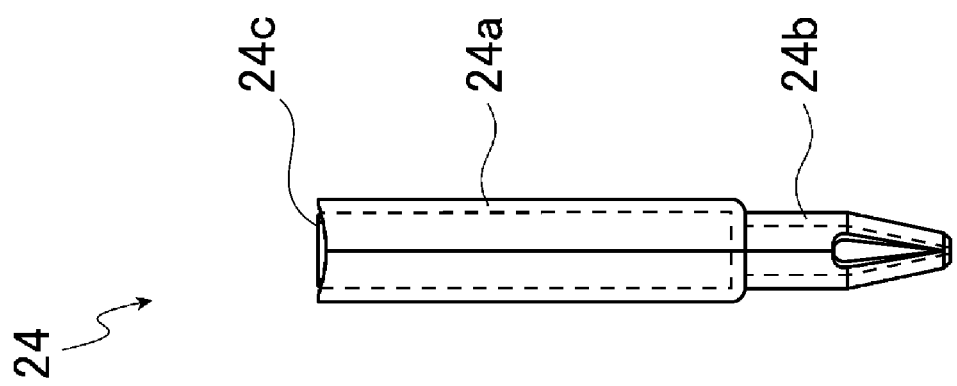
FIG. 3B is a schematic side view showing the second contact member of the electric contact according to the first embodiment.

Hereinafter, a first embodiment of the present invention will be described with reference to FIGS. 1A to 6C.

As shown in FIGS. 1A to 4, a contact pin 10 as an "electric contact" is arranged in an IC socket 11 as an "electric component socket". The IC socket 11 is arranged on a wiring board P. An IC package 12 as an "electric component" is housed in the IC socket 11.

The IC package 12 shown in FIG. 1B includes a package main body 12a in a rectangular shape in plane view, and a plurality of spherical terminals 12b are protruding and formed on a matrix on a lower surface of the package main body 12a.

Meanwhile, as shown in FIGS. 1A and 1B, the socket 11 includes: a socket main body 14 fixed to the wiring board P and configured to house the IC package 12; a cover member not shown provided on the socket main body 14 in an openable and closable manner and configured to press the IC package 12; and a lock mechanism not shown for locking with the cover member in a closed state.

More specifically, the socket main body 14 includes: a contact pin unit 15 with insulation properties made of a synthetic resin provided with a plurality of contact pins 10; and a floating plate 16 arranged above the contact pin unit 15 and configured to house the IC package 12.

The contact pin unit 15 includes a first plate 19, a second plate 20, and a third plate 21 in order from below. Through holes 19a, 20a, and 21a for housing the contact pins 10 are formed in the first to third plates 19 to 21, respectively.

Here, the through hole 19a of the first plate 19 includes a large diameter portion 19b on the upper side and a small diameter portion 19c on the lower side. The through hole 21a of the third plate 21 includes a large diameter portion 21b on the lower side and a small diameter portion 21c on the upper side. Providing the small diameter portions 19c and 21c can prevent the housed contact pin 10 from getting out from the contact pin unit 15.

In this way, the contact pin 10 is configured to electrically connect the wiring board P arranged on one side and the IC package 12 arranged on the other side.

As shown in FIGS. 1A to 4, the contact pin 10 includes: a first contact member 23 formed by a conductive material and brought into contact with the IC package 12; a second contact member 24 formed by a conductive material and brought into contact with the wiring board P; and a coil spring 25 formed by a conductive material and configured to energize the first contact member 23 and the second contact member 24 in opposite directions.

The first contact member 23 is created by, for example, cutting work, and as shown in FIGS. 1A, 1B, 2A, and 2B, the first contact member 23 includes: an insertion rod portion 23a inserted to the coil spring 25; a contact portion 23b brought into contact with the spherical terminal 12b of the IC package 12; and a stepped portion 23c formed on a base end portion of the insertion rod portion 23a (between the insertion rod portion 23a and the contact portion 23b) and abutted to one end portion of the coil spring 25.

In the first contact member 23, the insertion rod portion 23a and the stepped portion 23c are housed in the large diameter portion 21b of the through hole 21a, and the contact portion 23b is inserted to the small diameter portion 19c.

A reduced diameter portion 23d (that is, a part in which the diameter decreases with an increase in the distance from a cylindrical portion 24a (described later) of the second contact member 24) is formed in the entire insertion rod portion 23a of the first contact member 23. Therefore, the diameter of the reduced diameter portion 23d is D1>D2 (see FIG. 2B).

Meanwhile, the second contact member 24 is created by, for example, curling work, and as shown in FIGS. 1A, 1B, 3A, and 3B, the second contact member 24 includes: the cylindrical portion 24a for inserting the insertion rod portion 23a of the first contact member 23; and a contact portion 24b brought into contact with the terminal of the wiring board P.

An opening surface 24c of the cylindrical portion 24a is formed so that the surface direction thereof is tilted relative to the expansion and contraction direction of the coil spring 25. A lower end portion of the coil spring 25 is abutted to the opening surface 24c, and the energizing force of the coil spring 25 presses the opening surface 24c downward (described later).

In the second contact member 24, the cylindrical portion 24a is housed in the large diameter portion 19b of the through hole 19a, and the contact portion 24b is inserted to the small diameter portion 19c thereof.

Figure 4:
FIG. 4 is a schematic side view showing a coil spring according to the electric contact of the first embodiment.
Figure 6C:
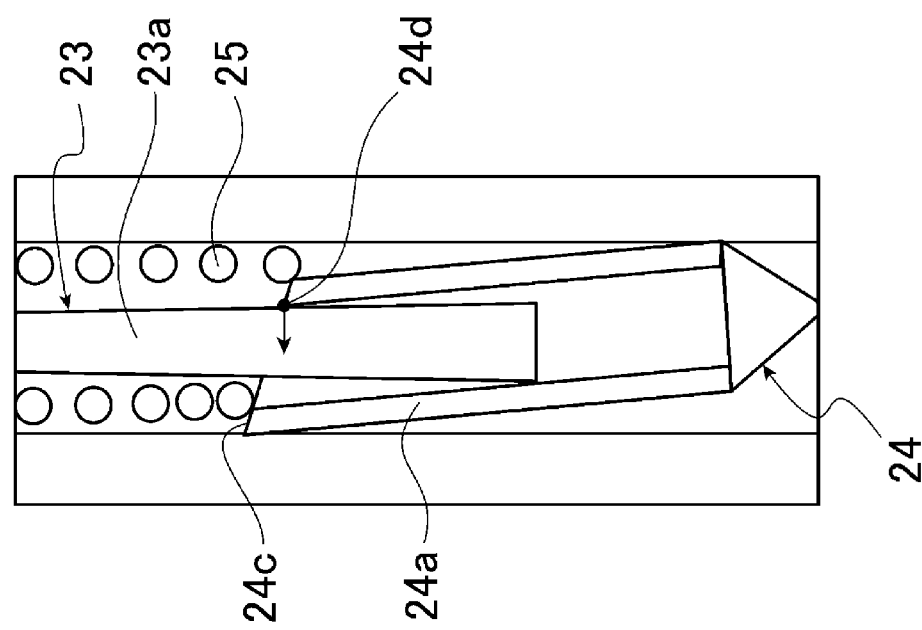
FIG. 6C is a conceptual cross-sectional view for describing operation of the first embodiment.

The coil spring 25 is formed by a conductive material, such as metal, and as shown in FIGS. 1A, 1B, and 4, the coil spring 25 is arranged in the through hole 20a of the second plate 20 and in the large diameter portion 21b of the through hole 21a of the third plate 21 in a state in which the insertion rod portion 23a of the first contact member 23 is inserted.

Next, a method of using the IC socket 11 will be described.

First, in a state in which the floating plate 16 of the IC socket 11 is raised, the contact portion 24a of the second contact member 24 protrudes downward as shown in FIG. 1A. In this case, the longitudinal direction of the first contact member 23, the second contact member 24, and the coil spring 25 is substantially vertical.

When the IC socket 11 is installed on the processing substrate P, the processing substrate P pushes up the second contact member 24 against the energizing force of the coil spring 25, and the first plate 19 is abutted to the wiring board P.

In this state, when the floating plate 16 is lowered as the IC package 12 is set on the IC socket 11, the first contact member 23 is pushed down against the energizing force of the coil spring 25, and the floating plate 16 is abutted to the third plate 21 (see FIG. 1B).

Here, as described, the opening surface 24c of the cylindrical portion 24a is tilted from the expansion and contraction direction of the coil spring 25. Therefore, the second contact member 24 receives pressing force in the transverse direction due to the energizing force of the coil spring 25 and is tilted from the vertical direction. As a result, the cylindrical portion 24a of the second contact member 24 is surely brought into contact with the insertion rod portion 23a of the first contact member 23. Therefore, the first and second contact members 23 and 24 can be surely short-circuited to obtain conduction with stable low electric resistance.

As described, the insertion rod portion 23a of the first contact member 23 is formed so that the diameter decreases with an increase in the distance from the cylindrical portion 24a of the second contact member 24. When the insertion rod portion 23a of the first contact member 23 is pushed down as the floating plate 16 is lowered, the contact point of the insertion rod portion 23a and the opening end of the cylindrical portion 24a moves along the reduced diameter surface of the insertion rod portion 23a. Therefore, even when the energizing force is increased as the coil spring 25 is compressed by pushing down the first contact member 23, the energizing force of pressing the cylindrical portion 24a in the transverse direction does not increase much, and thus, the contact pressure of the cylindrical portion 24a and the insertion rod portion 23a does not increase much. As a result, the operation of lowering the floating plate 16 is smooth.

Next, results of comparing the contact pin 10 of the first embodiment to contact pins of comparative examples will be described with reference to FIGS. 5A to 5C and FIGS. 6A to 6C.

FIG. 5A illustrates a contact pin 30 according to a first comparative example, and the surface direction of an opening surface 31c provided on a cylindrical portion 31a of a second contact member 31 coincides with the expansion and contraction direction of a coil spring 32.

Therefore, when an insertion rod portion 33a of the first contact member 33 is lowered as shown in FIG. 6A, the second contact member 31 is tilted in some cases and is not tilted in other cases, depending on the amount of deflection of the coil spring 32. Thus, the insertion rod portion 33a of the first contact member 33 and the cylindrical portion 31a of the second contact member 31 come into contact with each other in some cases and do not come into contact with each other in other cases. Therefore, the electric resistance value of the contact pin 30 of the first comparative example significantly changes in each use.

FIG. 5B illustrates a contact pin 40 according to a second comparative example, and the surface direction of an opening surface 41c provided on a cylindrical portion 41a of a second contact member 41 is tilted from the expansion and contraction direction of a coil spring 42. Therefore, as shown in FIG. 6B, when a first contact member 43 is lowered, the second contact member 41 is titled, and the cylindrical portion 41a always comes into contact with an insertion rod portion 43a of the second contact member 43. Thus, the electric resistance value does not significantly change in each use of the contact pin 40 of the second comparative example.

On the other hand, in the contact pin 40 of the second comparative example, the diameter of the insertion rod portion 43a is uniform regardless of the distance from the cylindrical portion 41a. Therefore, in the second comparative example, when the amount of compression of the coil spring 42 increases as the insertion rod portion 43a is lowered, the force of the coil spring 42 pressing the cylindrical portion 41a in the transverse direction increases at a contact point 41d, and thus, the contact pressure of the insertion rod portion 43a and the cylindrical portion 41a increases. As a result, the operation of lowering a floating plate not shown is unstable.

FIG. 5C illustrates the contact pin 10 according to the first embodiment. In the contact pin 10, the surface direction of the opening surface 24c of the cylindrical portion 24a is tilted from the expansion and contraction direction of the coil spring 25. Therefore, as in the second comparative example, when the first contact member 23 is lowered, the second contact member 21 is tilted (see FIG. 6C), and the cylindrical portion 21a always comes into contact with the insertion rod portion 23a of the second contact member 23. Thus, the electric resistance value does not significantly change in each use of the contact pin 10 of the first embodiment.

Furthermore, the diameter of the insertion rod portion 23a decreases with an increase in the distance from the cylindrical portion 24a. Therefore, even when the amount of compression of the coil spring 25 increases as the insertion rod portion 23a is lowered, the force of the coil spring 25 pressing the cylindrical portion 24a in the transverse direction does not increase at a contact point 24d in the contact pin 10 of FIG. 6C. As a result, the operation of lowering the first contact member 23 is smooth.

Although the "tilt portion" is formed by tilting the opening surface 24c of the cylindrical portion 24a from the expansion and contraction direction of the coil spring 25 in the first embodiment, a tilt portion with another configuration may be adopted as long as the opening end inside surface of the cylindrical portion 24a can be brought into contact with the insertion rod portion 23a by tilting the second contact member 24.

Although the "reduced diameter portion" (that is, a part with a shape in which the diameter decreases with an increase in the distance from the cylindrical portion 24a) is provided on the entire insertion rod portion 23a of the first contact member 23 in the first embodiment, such a shape may be provided only at a tip portion of the insertion rod portion 23a. More specifically, the advantageous effects of the first embodiment can be obtained if such a shape is formed in a range of contact of the insertion rod portion 23a and the cylindrical portion 24a when the floating plate 16 moves from the lowest position to the highest position.

Furthermore, the first contact member 23 is brought into contact with the IC package 12, and the second contact member 24 is brought into contact with the wiring board P in the first embodiment. However, the first contact member 23 may be brought into contact with the wiring board, and the second contact member 24 may be brought into contact with the IC package 12.

REFERENCE SIGNS LIST

10 contact pin (electric contact)
11 IC socket (electric component socket)
12 IC package (electric component)
12a package main body
12b spherical terminal
14 socket main body
15 contact pin unit
16 floating plate
19 first plate
19a, 20a, 21a through holes
20 second plate
21 third plate
23 first contact member
23a insertion rod portion
23b contact portion
23c stepped portion
24 second contact member
24a cylindrical portion
24b contact portion
25 coil spring
P processing substrate

The invention claimed is:

1. An electric contact to electrically connect a wiring board and an electric component by using:
   a first contact member conducted with one of the wiring board and the electric component;
   a second contact member conducted with the other of the wiring board and the electric component; and
   a coil spring to energize the first contact member and the second contact member in opposite directions,
   wherein;
   the first contact member comprises an insertion rod portion passing through the coil spring,
   the second contact member comprises a cylindrical portion to which a part of the insertion rod portion passing through the coil spring is inserted,
   a reduced diameter portion in which the diameter decreases with an increase in the distance from the cylindrical portion is formed at least near a tip of the insertion rod portion, and
   the electric contact comprises a tilt portion to tilt the second contact member to bring an opening end inside surface of the cylindrical portion into contact with the insertion rod portion.

2. The electric contact according to claim 1, wherein the tilt portion is an opening surface of the cylindrical portion having a surface direction titled from an expansion and contraction direction of the coil spring, and the opening surface is pressed by energizing force of the coil spring to tilt the second contact member.

3. An electric component socket comprising:
   a socket main body arranged on a wiring board and including a housing portion to house an electric component; and
   an electric contact to electrically connect the wiring board and the electric component arranged on through holes provided on the socket main body, wherein
   the electric contact comprises:
   a first contact member conducted with one of the wiring board and the electric component;
   a second contact member conducted with the other of the wiring board and the electric component; and
   a coil spring to energize the first contact member and the second contact member in opposite directions,
   wherein;
   the first contact member comprises an insertion rod portion passing through the coil spring,
   the second contact member comprises a cylindrical portion to which a part of the insertion rod portion passing through the coil spring is inserted,
   a reduced diameter portion in which the diameter decreases with an increase in the distance from the cylindrical portion is formed at least near a tip of the insertion rod portion, and
   the electric contact comprises a tilt mechanism configured to tilt the second contact member to bring an opening end inside surface of the cylindrical portion into contact with the insertion rod portion.

4. The electric component socket according to claim 3, wherein
   the tilt mechanism is an opening surface of the cylindrical portion having a surface direction titled from an expansion and contraction direction of the coil spring, and the opening surface is pressed by energizing force of the coil spring to tilt the second contact member.

\* \* \* \* \*